(12) United States Patent
Heffner et al.

(10) Patent No.: US 6,319,740 B1
(45) Date of Patent: Nov. 20, 2001

(54) MULTILAYER PROTECTIVE COATING FOR INTEGRATED CIRCUITS AND MULTICHIP MODULES AND METHOD OF APPLYING SAME

(75) Inventors: Kenneth H. Heffner; Curtis W. Anderson, both of Largo, FL (US)

(73) Assignee: Honeywell International Inc., Morristown, NJ (US)

( * ) Notice: Subject to any disclaimer, the term of this patent is extended or adjusted under 35 U.S.C. 154(b) by 883 days.

(21) Appl. No.: 08/549,349

(22) Filed: Oct. 27, 1995

(51) Int. Cl.[7] .............................. B05D 1/36; B05D 5/12; H02L 21/00
(52) U.S. Cl. .................. 438/26; 427/77; 427/96; 427/126.2; 427/453; 427/454; 438/64; 438/106
(58) Field of Search ................ 427/96, 103, 118, 427/126.2, 214, 419.1–419.7, 453, 454, 523, 77, 562; 361/762–764; 174/755; 257/787–791; 437/209, 211, 218, 219; 438/26, 64, 106

(56) References Cited

U.S. PATENT DOCUMENTS

| | | | | |
|---|---|---|---|---|
| 3,170,813 | * | 2/1965 | Duncan et al. | 427/453 |
| 5,258,334 | * | 11/1993 | Lantz, II | 437/238 |
| 5,290,354 | * | 3/1994 | Haluska | 427/419.7 |

* cited by examiner

Primary Examiner—Brian K. Talbot
(74) Attorney, Agent, or Firm—Thomas A. Rendos; Robert E. Greenstien

(57) ABSTRACT

Disclosed is a method of forming a multilayer opaque coating on an integrated circuit or multichip module. First, an opaque coating composition is heated to a molten state and the molten opaque coating composition is applied so as to form an opaque coating that overlies active circuitry on the surface of the integrated circuit or multichip module, to prevent optical and radiation based inspection and reverse engineering of the active circuitry. Further coatings are applied over the opaque coating to shield the active circuitry of the integrated circuit or multichip module from the adverse affects of electromagnetic interference and/or high energy radiation.

8 Claims, 2 Drawing Sheets

MULTILAYER PROTECTIVE COATING FOR INTEGRATED CIRCUITS AND MULTICHIP MODULES AND METHOD OF APPLYING SAME

BACKGROUND OF THE INVENTION

This invention relates to opaque coatings for electronic devices. In particular, the present invention is a multilayer opaque protective coating and method of applying the multilayer coating to integrated circuits and multichip modules. The multilayer coating inhibits inspection and reverse engineering of integrated circuits and multichip modules.

Opaque coatings and methods of applying opaque coatings to electronic devices to inhibit inspection and reverse engineering are generally known. U.S. Pat. No. 5,399,441 to Bearinger et al. discloses one such method of forming an opaque coating on an integrated circuit. In Bearinger et al., an opaque ceramic coating is formed on an integrated circuit by a process which includes selectively applying a coating composition comprising a silica precursor resin and a filler onto the surface of the integrated circuit. A liquid mixture that includes the silica precursor resin and the filler is selectively applied to the integrated circuit by (1) masking the circuit, applying the liquid mixture and removing the mask, (2) selectively "painting" the circuit or (3) silk screening the circuit.

The coated integrated circuit is then heated at a temperature sufficient to convert the coating composition (i.e., liquid mixture) to a silica containing ceramic matrix having the filler distributed therein. Preferably, the integrated circuit with coating composition thereon is heated in a Lindberg furnace at a temperature within the range of about 50° C. to 425° C. for generally up to six (6) hours, with less than about three (3) hours being preferred, to convert the coating composition to a silica containing ceramic matrix. In Bearinger et al. the preferred silica precursor resin is hydrogen silsesquioxane resin (H-resin). To achieve a coating opaque to radiation, a filler comprising insoluble salts of s heavy metals is combined with the silica precursor resin. To achieve a coating impenetrable to visual light, an optically opaque filler is combined with the silica precursor resin.

Because the method of applying the opaque coating to an integrated circuit of Bearinger et al. requires an extensive heating time period to transform the coating composition to a silica containing ceramic matrix, Bearinger et al.'s method is not particularly cost effective or efficient on a mass production level. The Bearinger, et al. coating does not provide full protection since the liquid mixture is applied to the integrated circuit at the wafer level and before assembly of the actual devices into integrated circuit or multichip module packages. Therefore, protection is not provided for packaging components such as wire bonds, bond pads, and inteconnects. In addition, though the opaque coating formed by the process of Bearinger et al. may prevent reverse engineering of the underlying circuit, Bearinger et al.'s opaque coating does not protect the underlying integrated circuit from the effects of electromagnetic interference and/or high energy radiation (such as may exist in outer space, in sensor and control electronics of commercial nuclear power generating plants and/or in equipment designed to survive nuclear explosions).

The U.S. Pat. No. 5,258,334 to Lantz, II discloses another process of applying an opaque ceramic coating to an integrated circuit. In Lantz, II, visual access to the topology of an integrated circuit is denied via an opaque ceramic produced by first mixing opaque particulate with a silica precursor. This mixture is then applied to the surface of the integrated circuit. The coated integrated circuit is then heated to a temperature in the range of 50° C. to 450° C. in an inert environment for a time within the range of one (1) second to six (6) hours to allow the coating to flow across the surface of the integrated circuit without ceramifying. The coated integrated circuit is then heated to a temperature in the range of 20° C. to 1000° C. in a reactive environment for a time in the range of two (2) to twelve (12) hours to allow the coating to ceramify. As with the above described Bearinger et al. patent, the method of applying the opaque coating of Lantz, II is time consuming and therefore not particularly cost effective or efficient on a mass production level. Likewise, as with the above described Bearinger et al. patent, the resulting coating does not provide full protection since the liquid mixture is applied to the integrated circuit at the wafer level and before assembly of the actual devices into integrated circuit or multichip module packages. Therefore, protection is not provided for packaging components such as wire bonds, bond pads, and inteconnects. In addition, as with the Bearinger et al. opaque coating, the opaque coating formed by the Lantz, II process does not protect the underlying integrated circuit from the effects of electromagnetic interference and/or high energy radiation.

There is a need for improved protective coatings for integrated circuits and multichip modules. In particular, there is a need for an improved protective coating that is both radiopaque and optically opaque to prevent inspection and/or reverse engineering of the topology of the integrated circuits and multichip modules. In addition, the protective coating should be capable of sheilding an underlying integrated circuit or multichip module from the adverse affects of electromagnetic interference an/or high energy radiation. Moreover, the protective coating should be capable of being applied to integrated circuits and multichip modules in a time efficient and cost effective process to permit coating application on a mass production level. Finally, there is a need to apply the protective coatings to the wire bond and interconnects in integrated circuit and multichip module packages. These areas are unprotected using a wafer level coating.

SUMMARY OF THE INVENTION

An object of the invention is to provide a method for applying thermal coatings to integrated circuits in a way that does not damage the circuit elements and connections so that multilayers of coatings can be applied to make such circuits resistant to inspection (reverse engineering) and damage from electromagnetic energy and radiation.

According to the invention, coating composition particles are selected so that they can enter a molten state in a flame spray and impact the circuit without causing damage to the circuit components. If the particles are too large they will damage the circuit. If they are too small they will cool too quickly and the coating will be imperfect. The flame spray with the molten particles is passed over the circuit at a distance at which the particles are still molten but heating to the circuit is at a safe level. Successive passes are made, building up the coating layer.

According to the invention, coating materials are selected to absorb different electromagnetic frequencies, such as visible light and X-rays, and the layers are built-up to a thickness that provides a desired level of attenuation.

According to the invention, a coating composition of a radiation resistant material is built-up to a thickness that protects the circuit from the damaging effects of the radiation.

A feature of the invention is that, by applying layers of different coatings, the circuit can be protected from reverse engineering as well as damage from external energy sources.

Another feature of the invention is that the process can be performed quickly on small circuits without damaging the delicate components and the thickness of the coatings is uniform along the circuit.

Other objects, benefits and features of the invention will be apparent to one of ordinary skill in the art from the drawings and detailed description.

DETAILED DESCRIPTION OF THE PREFERRED EMBODIMENT

Figure 1:
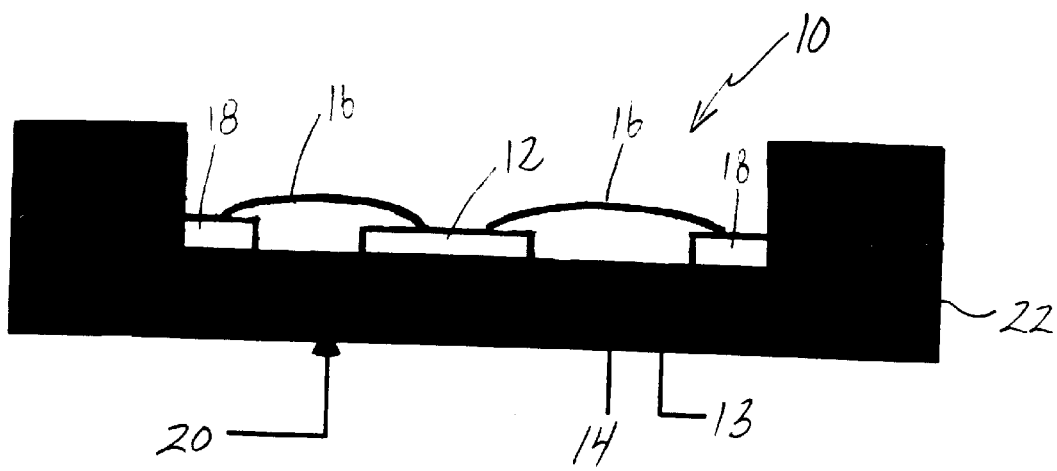
FIG. 1 is a sectional view of an integrated circuit or multichip module prior to the application of multiple layers of protective opaque coatings in accordance with the present invention.

A semiconductor integrated circuit device, such as an integrated circuit (IC) or multichip module (MCM) 10 to be coated in accordance with the present invention is illustrated generally in FIG. 1. The IC or MCM 10 includes a single, active circuitry semiconductor chip 12 (in the case of an IC) or multiple, active circuitry semiconductor chips 12 (in the case of a MCM). The semiconductor chip(s) 12 is mounted on a surface 13 of a substrate 14 and includes lead wires 16 that are connected to pads 18 also mounted on the surface 13 of the substrate 14. The pads 18 serve as ports for electrical connection to external sources (not shown). The substrate 14 with the chip(s) 12 and pads 18 mounted thereto is housed within a ceramic package 20 defined by a base member 22, a lid member 24 and a lid seal 26 (the lid member 24 and lid seal 26 not being shown in FIG. 1.).

Figure 3:
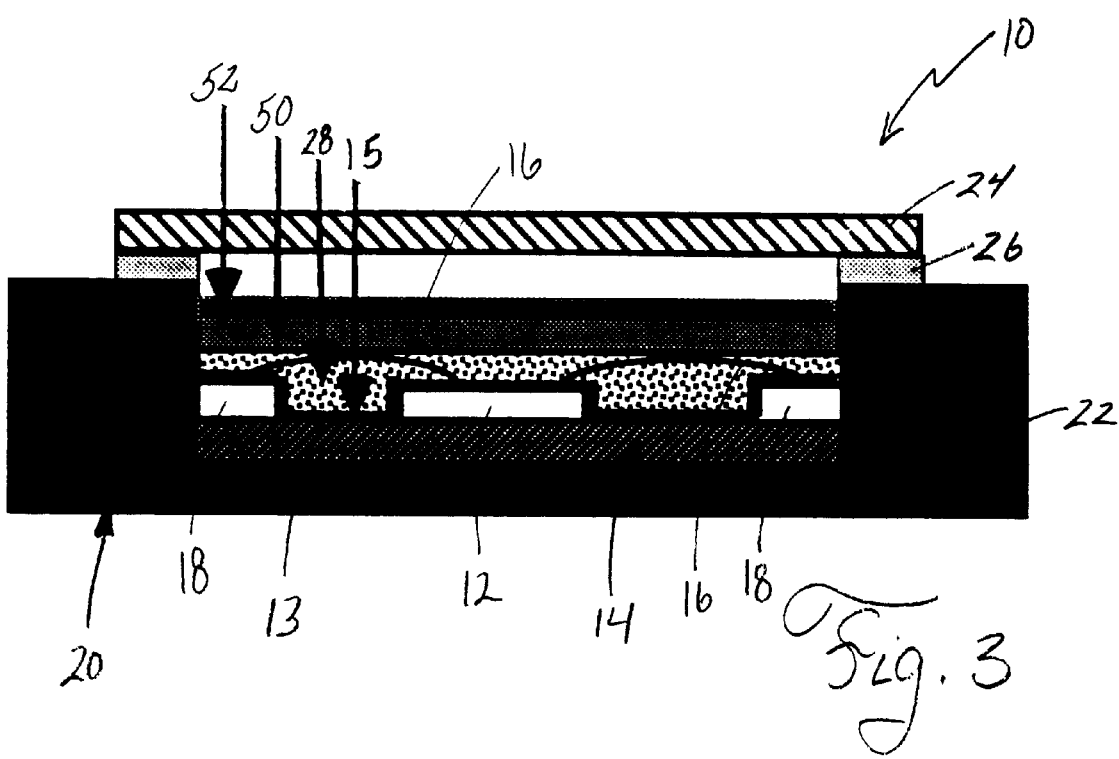
FIG. 3 is a sectional view similar to FIG. 1 of the integrated circuit or multichip module with the multiple layers of protective opaque coatings applied thereto.

The IC or MCM 10 of FIG. 1, in accordance with the present invention, may be first coated with an organic based film, primer coating 15 (see FIG. 3) that is applied by way of reactive vacuum deposition, thermal spray or liquid coating process. When the primer coating 15 is to be applied, a primer coating composition that defines the primer coating 15 is prepared. The primer coating composition is prepared from chemical materials that are compatible with the materials from which the IC or MCM 10 is manufactured. In the present invention, the primer coating composition may be Parylene, a solid thermoplastic, solid siloxane resin or a furfural based liquid polymer. In one preferred embodiment, the primer coating composition is siloxane. Once prepared, the primer coating composition is applied to the IC or MCM 10 devices using reactive vacuum deposition for Parylene, thermal spray deposition (as described later) for thermoplastic and siloxanes and liquid drop deposition for the furfural based polymer. As seen in FIG. 3, the formed primer coating 15 completely covers the semiconductor chip(s) 12, lead wires 16, pads 18 and the surface 13 of the substrate 14 housed within the base member 22. However, the primer 15 may be applied so as to only partially or completely cover any one of or more of the semiconductor chip(s) 12, leads 16, pads 18 and/or surface 13. In the present invention, once formed, the primer coating 15 has a thickness within the range of 0.1 mils to 2 mils. In one preferred embodiment, the formed primer coating 15 has a thickness of 0.7 mils.

If the primer coating 15 is applied to the IC or MCM 10, the primer coating 15 is allowed to form (i.e., cure). The IC or MCM 10 is then coated with a protective opaque coating 28 (see FIG. 3) by a thermal spray process 29 illustrated in FIG. 2. The thermal spray process 29, of the present invention, is a line of sight coating process that includes a thermal spray gun 30 having a nozzle 31. A heat energy source 32 is delivered to the nozzle 31 (in a known manner) to heat a ceramic particle based coating composition 33 (that defines the opaque coating 28) also delivered to the nozzle 31 (in a known manner). The heat energy source 32 uses a flame 34 to heat the coating composition 33 to a molten state that is defined by molten liquefied particles 35. The molten liquefied particles 35 (defining the coating composition 33) are carried to the IC or MCM 10 by a carrier gas jet 36 also delivered to the nozzle 31 (in a known manner). The IC or MCM 10 is supported on a support element 38 that may act as heat sink during the coating process.

The primer coating 15 is applied prior to the protective opaque coating 28, to improve the resistance of those IC's or MCM's 10 that are electronically delicate and therefore susceptible to mechanical and/or thermal damage that may result from the molten liquefied particles 35 being driven toward the IC or MCM 10 (via carrier gas jet 36) and impacting the IC or MCM 10 at a high velocity. In practice, the opaque coating 28 typically completely covers the primer coating 15. Examples of electronically delicate IC's or MCM's 10 are those IC's or MCM's 10 having thin lead wires 16, weak bonding joints between the lead wires 16 the pads 18 and semiconductor chip(s) 12, and/or circuit architecture that is susceptible to thermal shock or impingement damage. If the IC or MCM 10 is not electronically delicate, the primer coating 15 is omitted and the opaque coating 28 is applied directly to the IC or MCM 10.

The thermal spray process 29 first requires the preparation of the ceramic particle based coating composition 33. It is desirable that the chemistry of the coating composition 33 (as well as the primer coating composition (if used)) be similar to the chemistry of the materials of the IC or MCM 10, such that attempted removal of the protective opaque coating 28 (formed from the coating composition 33) and the primer coating 15 (if used) from the IC or MCM 10 (for inspection and/or reverse engineering of the topology of the IC or MCM) via chemical methods will simultaneously destroy the IC or MCM 10. In the present invention, the coating composition 33 may be a single chemical component or a multi chemical component composition, partially or entirely formed from any one of alumina, beryllia, silica, silicon carbide, aluminum nitride, fused alumina-titanium oxide, fused alumina-titanium dioxide and nylon or alumina-titanium oxide and teflon, barium titanate, or other ceramic oxides or silicates. In one preferred embodiment fused alumina-titanium oxide was found to provide a desirable coating composition 33 for the protective opaque coating 28.

The coating composition 33 is prepared by manufacturing the chemical materials of the coating composition 33 into a powder or sintered rod having particle sizes within the range often microns to sixty microns. Particle sizes in excess of sixty microns tend to cause mechanical damage to the IC or MCM 10 due to that force at which the carrier gas jet 36 delivers the molten liquefied particles 35 to the IC or MCM 10. Particle sizes less than ten microns tend to cause transformation of the particle based coating composition 33 into a liquid stream (rather than molten liquefied particles 35) that may be difficult to control during the application process. In one preferred embodiment, a coating composition 33 prepared in the form of a sintered rod with the coating composition 33 having a particle size within the range often microns to twenty microns is desirable.

Once the coating composition 33 is prepared, the coating composition 33, the heat energy source 32 and the carrier gas jet 36 are simultaneously delivered to the nozzle 31 of the thermal spray gun 30. The heat energy source 32 can take the form of a plasma arc, an electric arc or a fuel gas. In one preferred embodiment, the heat energy source is a fuel gas 40 (preferably acetylene) which is combined with oxygen 42 to create that flame 34 that is of a temperature sufficient to transform the ceramic particle based coating composition 33 to molten liquefied particles 35. In one preferred embodiment, this temperature is in the range of between 200° C. and 3000° C. The molten liquefied particles 35 are applied to the IC or MCM 10 over the primer coating 15 (if used) via the carrier gas jet 36 which carries the molten liquefied particles 35 to the IC or MCM 10 and causes the particles 35 to impact upon the IC or MCM 10. The molten liquefied particles 35 undergo a "splat" upon impact with the surface of the IC or MCM 10, and then coalesce to form a contiguous coating that thickens with continued successive depositions of the molten liquefied particles 35 to form the lamellar protective opaque coating 28. In one preferred embodiment, the carrier gas jet 36 is pressurized nitrogen which is delivered to the nozzle 31 of the thermal spray gun 30 in the range 10–100 cfm.

Figure 2:
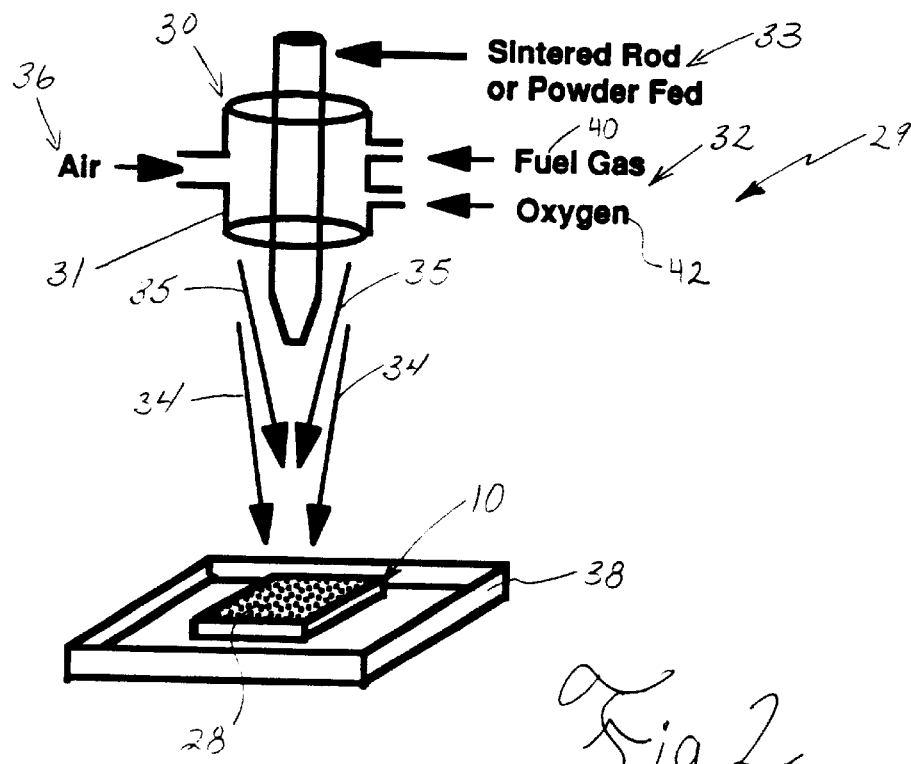
FIG. 2 is a schematic elevational view of at least one protective opaque coating being applied to the integrated circuit or multichip module shown in FIG. 1.

As seen in FIG. 2, in practice, the nozzle 31 of the thermal spray gun 30 is positioned above the IC or MCM 10 which is held in place by the support element 38 which can draw heat away from the IC or MCM 10 during the application process. Typically, the nozzle 31 is positioned from the IC or MCM 10 within the range of between five inches and seven inches. In one preferred embodiment, the nozzle 31 is positioned six inches from the IC or MCM 10. The molten liquefied particles 35 can be applied over the primer coating 15 (if used) in successive layers or as a single burst depending upon the desired coating thickness and the thermal limitations of the IC or MCM 10. In one preferred embodiment, the thickness of the formed protective coating 28 is in the range of between 0.1 mil and 200 mils. The molten liquefied particles 35 are applied by moving the nozzle 31 of the thermal spray gun 30 back and forth over the surface of the IC or MCM 10, by moving the IC or MCM 10 relative to the nozzle 31, or by moving both the nozzle 31 and the IC or MCM 10 relative to one another. In one preferred embodiment, the nozzle 31 is moved relative to a stationary IC or MCM 10.

Once the molten liquefied particles 35 are applied over the primer coating 15 (if used), they form a lamellar protective opaque coating that adhesively bonds to the surface of the IC or MCM 10 and is abrasion resistant, provides a hermetic seal, and prevents both active and passive, chemical, optical and radiation based inspection and/or reverse engineering of the active and inactive circuitry of the IC or MCM 10. As seen in FIG. 3, the formed protective opaque coating 28 completely covers the semiconductor chip(s) 12, lead wires 16, pads 18 and the surface 13 of the substrate 14 housed within the base member 22. However, the protective, opaque coating 28 may be applied so as to only partially or completely cover any one of or more of the semiconductor chip(s) 12, leads 16, pads 18 and/or surface 13.

Once the opaque coating 28 is formed (i.e., cured), the IC or MCM 10 is then coated with a radiation hardening coating 50 and/or a electromagnetic interference (EMI) hardening coating 52. Both the radiation hardening coating 50 and the EMI hardening coating 52 are shown as having been used in FIG. 3. However, it is to be understood that only one or the other of the coatings 50 and 52 may be used, and that EMI coating 52 may be applied before the radiation coating 50. The radiation hardening coating 50 shields the IC or MCM 10 (i.e., active circuitry) from the adverse affects of high energy radiation, while the EMI hardening coating 52 shields the IC or MCM 10 (i.e., active circuitry) from the adverse affects of EMI.

As with the opaque coating 28, both of the coatings 50 and 52 are formed from ceramic particle based coating compositions that have a chemistry similar to the chemistry of the materials of the IC or MCM 10, such that attempted removal of the coatings 50, 52, 28 and 15 (if used) from the IC or MCM 10 (for inspection and/or reverse engineering of the topology of the IC or MCM) via chemical methods will simultaneously destroy the IC or MCM 10. As with the coating composition 33, the coating compositions from which the coatings 50 and 52 may be a single chemical component or a multi chemical component compositions. The composition of the radiation coating 50 may be any one of barium titanate, lead oxide, tungsten carbide, bismuth oxide or other heavey metal compounds. In one preferred embodiment, barium titanate was found to provide a desirable composition for the radiation coating 50. The composition of the EMI coating 52 may be any one of titanium monoxide, chromium carbide, zinc, copper or other conductive metals. In one preferred embodiment, titanium monoxide was found to provide a desirable composition for the EMI coating 52.

Since the coating compositions of the coatings 50 and 52 are ceramic particle based like the coating composition 33 of the opaque coating 28, each coating 50 and 52 can be applied by the thermal spray process 29 (parameters and technique) discussed above, with the form of the compositions for the coatings 50 and 52 (e.g., sintered rod), particle size ranges (i.e., ten to sixty microns with 10 to twenty microns being preferred), application temperature range (i.e., 200° C. to 3000° C), etc., being applicable.

As seen in FIG. 3, the formed EMI coating 52 and the formed radiation coating 50 completely cover the opaque coating 28 the primer coating 15 (if used), semiconductor chip(s) 12, lead wires 16, pads 18 and the surface 13 of the substrate 14 housed within the base member 22. However, the EMI coating 52 and the radiation coating 50 may be applied so as to only partially or completely cover any one of or more of the opaque coating 28, the primer coating 15 (if used), semiconductor chip(s) 12, leads 16, pads 18 and/or surface 13. In the present invention, once formed, the primer coating 15 has a thickness within the range of 0.1 mils to 2 mils. In one preferred embodiment, the thickness of each of the formed coatings 50 and 52 is in the range of between 0.1 mil and 200 mils.

The primer coating composition can be applied and cured to the primer coating 15 (to achieve complete coverage as shown in FIG. 3) in 1 to 60 minutes. The molten liquefied particles 35 can be applied and formed over the primer coating 15 on the surface of the IC or MCM 10 (to achieve complete coverage as shown in FIG. 3) in 15 to 600 seconds. The radiation coating 50 can be applied and formed over the opaque coating 28 (to achieve complete coverage as shown in FIG. 3) in 15 to 600 seconds. The EMI coating 52 can be applied and formed over the radiation coating 50 (to achieve complete coverage as shown in FIG. 3) in 15 to 600 seconds. The multiple layers of coating can be fully applied and cooled and the IC or MCM 10 ready for use in only 2 to 80 minutes. Therefore, the thermal spray process is capable of producing inspection and/or reverse engineering proof IC's or MCM's 10 in a time efficient and cost effective manner that permits coating application on a mass production level.

Although the present invention has been described with reference to preferred embodiments, workers skilled in the art will recognize that changes may be made in form and detail without departing from the spirit and scope of the invention.

What is claimed is:

1. A method of forming a multilayer coating on a semiconductor integrated circuit device comprising the steps of:

preparing first particles of a first coating composition;

applying the first particles to a flame stream which is at a temperature sufficient to place the first particles in a molten state;

building a specific thickness first layer of said first coating composition by passing the flame stream across the integrated circuit in successive passes over the integrated circuit;

preparing second particles of a second coating composition;

applying the second particles to a flame stream which is at a temperature sufficient to place the second particles in a molten state;

building a specific thickness of a said second coating composition on said first layer by passing the flame stream across the integrated circuit in successive passes over the integrated circuit; and selecting the size of said first and second particles so that the particles attain a molten state in the flame stream and produce an impact force less than a specific level when striking the circuit in a molten state.

2. The method of claim 1, wherein said successive passes occur at a specific distance above the integrated circuit at which said first and second particles strike the integrated circuit in a molten state and the temperature elevation of the integrated circuit is below a specific temperature.

3. The method of claim 1 wherein one of said first and second coating compositions comprises a material that attenuates energy above the visible spectrum and said one coating has a thickness on the integrated circuit selected to attenuate said energy to by a selected magnitude.

4. The method of claim 1 wherein of said first and second coating compositions is selected from a group of materials that are at that is at least semiconductive and has a thickness on the integrated circuit to attenuate electromagnetic interference by a specific magnitude.

5. The method of claim 3 wherein said material is selected from the group consisting of barium titanate, lead oxide, tungsten carbide, and bismuth oxide.

6. The method of claim 1, wherein one of said first coating composition and said second coating composition comprises a material that is opaque to electromagnetic energy at frequencies below and including x-ray and said one coating has a thickness on the integrated circuit selected to attenuate said energy by a specific magnitude.

7. The method of claim 4 wherein said group consist of titanium monoxide, chromium carbide, zinc, and copper.

8. The method of claim 6 wherein said material is selected from the group consisting of fused alumina-titanium oxide, fused alumina-titanium dioxide and nylon, and fused alumina-titanium oxide and teflon barium titanate.

* * * * *

UNITED STATES PATENT AND TRADEMARK OFFICE
CERTIFICATE OF CORRECTION

PATENT NO. : 6,319,740 B1
DATED : November 20, 2001
INVENTOR(S) : Kenneth H. Heffner and Curtis W. Anderson It is certified that error appears in the above-identified patent and that said Letters Patent is hereby corrected as shown below:

Column 1,
Line 5, insert
-- The United States Government may have certain rights to this invention under government contract MDA904-92-C-7066. --

Signed and Sealed this

Twenty-first Day of June, 2005

JON W. DUDAS
*Director of the United States Patent and Trademark Office*